(12) United States Patent
Nakatani et al.

(10) Patent No.: US 7,335,989 B2
(45) Date of Patent: Feb. 26, 2008

(54) SEMICONDUCTOR DEVICE AND PRODUCTION METHOD THEREFOR

(75) Inventors: Goro Nakatani, Kyoto (JP); Hitoshi Tamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 94 days.

(21) Appl. No.: 10/919,385

(22) Filed: Aug. 17, 2004

(65) Prior Publication Data

US 2005/0051899 A1    Mar. 10, 2005

(30) Foreign Application Priority Data

Sep. 5, 2003   (JP)  ............... 2003-314240

(51) Int. Cl.
*H01L 23/522* (2006.01)
(52) U.S. Cl. ............... 257/751; 257/753; 257/758; 257/774
(58) Field of Classification Search ............... 257/774, 257/753; 438/627
See application file for complete search history.

(56) References Cited

U.S. PATENT DOCUMENTS

| | | | |
|---|---|---|---|
| 6,037,664 A * | 3/2000 | Zhao et al. ............... | 257/758 |
| 6,143,646 A * | 11/2000 | Wetzel ............... | 438/637 |
| 6,255,226 B1 * | 7/2001 | Zheng et al. ............... | 438/734 |
| 6,271,127 B1 * | 8/2001 | Liu et al. ............... | 438/638 |
| 6,475,836 B1 | 11/2002 | Suzawa et al. | |
| 6,495,879 B1 * | 12/2002 | Kobayashi ............... | 257/310 |
| 6,548,900 B1 * | 4/2003 | Kusumi ............... | 257/758 |
| 2002/0132392 A1 | 9/2002 | Nakatani et al. | |
| 2003/0111735 A1 * | 6/2003 | Lee ............... | 257/774 |

FOREIGN PATENT DOCUMENTS

| | | |
|---|---|---|
| JP | 04-196251 | 7/1992 |
| JP | 07-183377 | 7/1995 |
| JP | 07-263555 | 10/1995 |
| JP | 2000-349300 | 12/2000 |

* cited by examiner

*Primary Examiner*—Stephen W. Smoot
(74) *Attorney, Agent, or Firm*—Rabin & Berdo, PC

(57) ABSTRACT

A semiconductor device provided with: a first interconnection layer provided on a semiconductor substrate; an interlevel insulation film provided over the first interconnection layer; a barrier layer provided between the first interconnection layer and the interlevel insulation film; and a second interconnection layer of gold provided as an uppermost interconnection layer on the interlevel insulation film. The barrier layer is formed in a region of the first interconnection layer including an interlevel connection opening region of the interlevel insulation, and the region is greater than the interlevel connection opening region. The second interconnection layer is electrically connected to the first interconnection layer via the barrier layer in the interlevel connection opening.

10 Claims, 3 Drawing Sheets

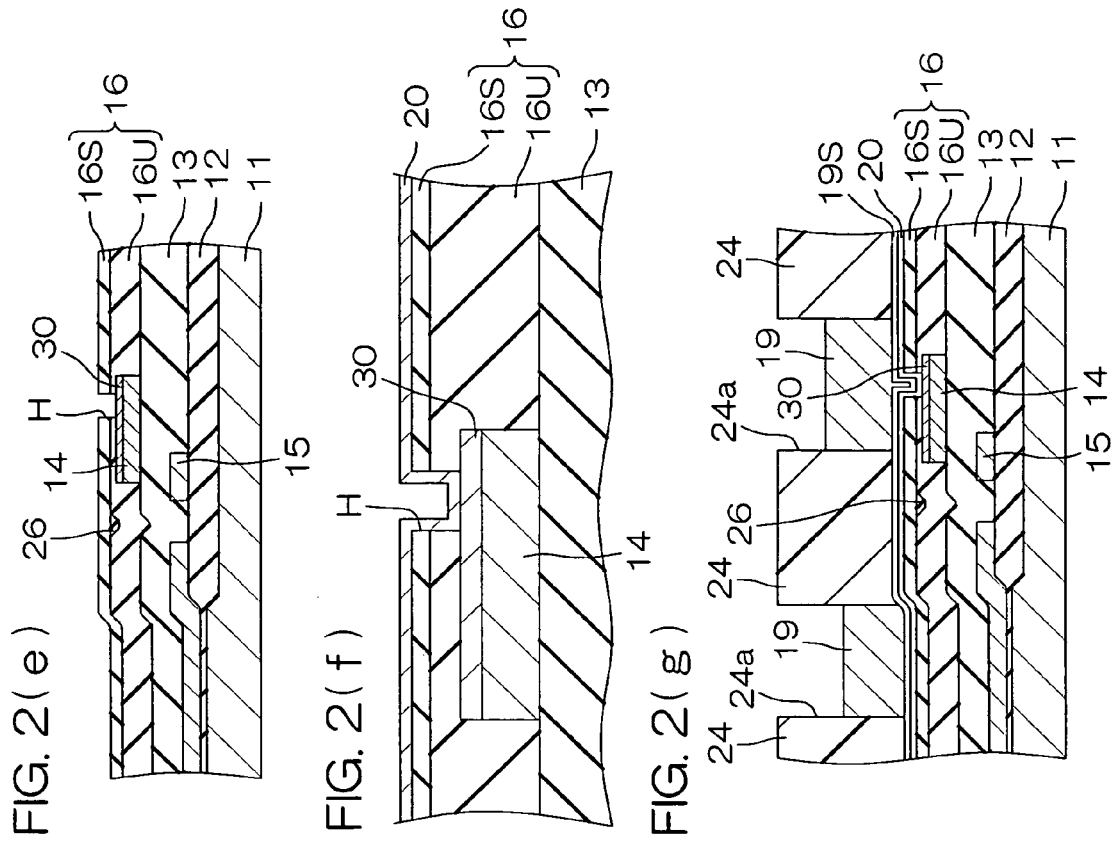
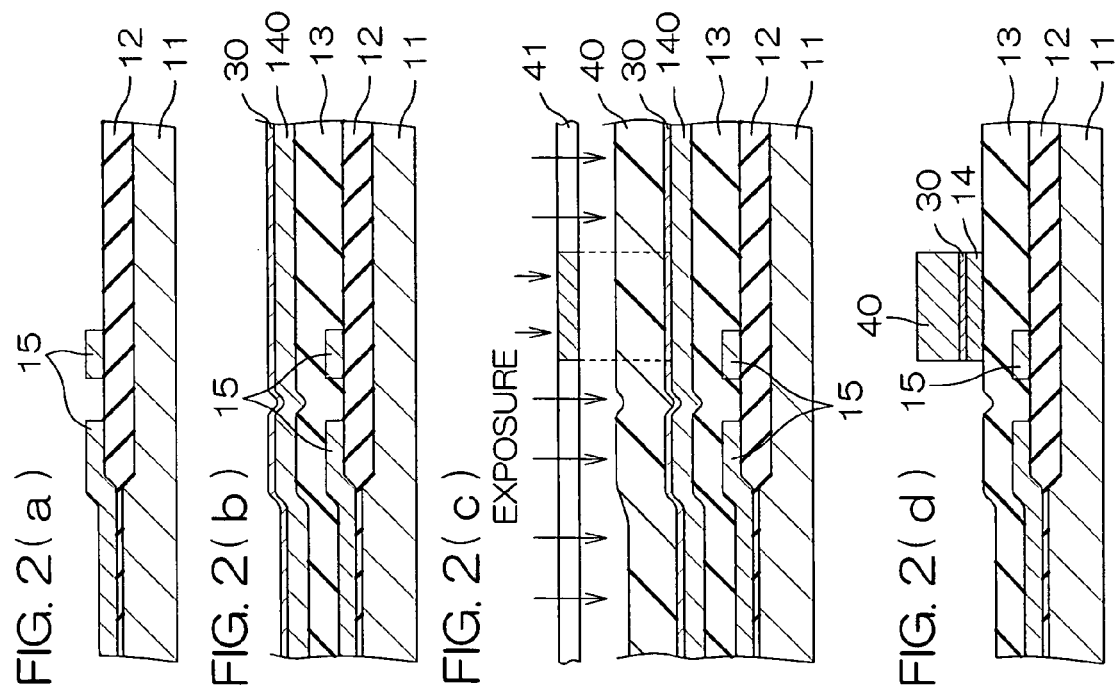

SEMICONDUCTOR DEVICE AND PRODUCTION METHOD THEREFOR

BACKGROUND OF THE INVENTION

1. Field of the Invention

The present invention relates to a semiconductor device having a plurality of interconnection layers and to a production method for the semiconductor device.

2. Description of Related Art

Semiconductor devices generally include a semiconductor substrate, a functional device provided in a surface of the semiconductor substrate, and a multi-level interconnection structure provided on the semiconductor substrate. The multi-level interconnection structure typically includes a plurality of interconnection layers stacked with the intervention of interlevel insulation films, and connection between the interconnection layers is achieved through contact holes formed in the interlevel insulating films.

Aluminum is conventionally employed as an interconnection material, but has a limitation in reduction of the resistance of the interconnection. As the sectional area of the interconnection is reduced with microminiaturization of the semiconductor device, a problem associated with the resistance of the interconnection arises. As a result, particularly, there is a demand for reduction of the resistances of a ground line and a power line.

In this connection, the inventor of the present invention, for example, has proposed in U.S. 2002-132392A1 that a gold layer is employed as an uppermost interconnection layer for the reduction of the resistance of the interconnection.

In this prior art, a barrier layer of a titanium thin film is disposed between an aluminum interconnection layer and the uppermost gold interconnection layer electrically connected to each other through a contact hole, so that migration of aluminum is prevented by the barrier layer.

However, gold is a highly diffusible material. Where the semiconductor device is allowed to stand at a high temperature for a long period of time (e.g., at 400° C. for 30 minutes to 1 hour) in an alloying process, for example, gold easily diffuses into the aluminum interconnection layer.

In practice, the titanium thin film has virtually no function as the barrier layer, but merely functions as an adhesive layer to contribute to the bonding between the interlevel insulation film and the gold layer and the bonding between the aluminum interconnection layer and the gold layer.

Besides the titanium thin film, a TiW thin film is conceivably usable as the barrier layer. However, like the titanium thin film, the TiW film has virtually no function for prevention of mutual diffusion between the gold layer and the aluminum interconnection layer, but merely functions as an adhesive layer.

Although electrically conductive materials having a barrier effect should be employed for the formation of the barrier layer, such materials have difficulty in forming a barrier layer having a uniform thickness. More specifically, the barrier layer is liable to have a reduced thickness on the bottom (especially, at a corner of the bottom) of the contact hole formed in the interlevel insulation film, resulting in poor coverage. Therefore, the barrier layer fails to provide a sufficient barrier effect in a heat treatment at a high temperature.

SUMMARY OF THE INVENTION

It is an object of the present invention to provide a semiconductor device and a production method therefor, which employ a gold interconnection layer and yet effectively suppress or prevent diffusion of gold.

A semiconductor device according to the present invention comprises: a first interconnection layer provided on a semiconductor substrate; an interlevel insulation film provided over the first interconnection layer; a barrier layer provided between the first interconnection layer and the interlevel insulation film on a region of the first interconnection layer including an interlevel connection opening region where an interlevel connection opening is formed in the interlevel insulation film, the region of the first interconnection layer having a greater area than the interlevel connection opening region; and a second interconnection layer of gold provided as an uppermost interconnection layer on the interlevel insulation film and electrically connected to the first interconnection layer via the barrier layer in the interlevel connection opening.

With the aforesaid arrangement, the barrier layer is provided on the region of the first interconnection layer having a greater area than the interlevel connection opening. The barrier layer is not provided on the interlevel insulation film, but provided between the first interconnection layer and the interlevel insulation film. Therefore, the barrier layer is free from the poor coverage in the interlevel connection opening formed in the interlevel insulation film, and advantageously has a uniform thickness everywhere on the first interconnection layer.

Thus, the diffusion of the materials between the first interconnection layer and the second interconnection gold layer can effectively be suppressed or prevented by the barrier layer having a uniform thickness.

The semiconductor device preferably further comprises an adhesive layer of an electrically conductive material provided between the interlevel insulation film and the second interconnection layer and between the barrier layer and the second interconnection layer in the interlevel connection opening to bond the second interconnection layer to the interlevel insulation film and the barrier layer. With this arrangement, the second interconnection layer is electrically connected to the barrier layer and, at the same time, properly bonded to the interlevel insulation film and the barrier layer by the adhesive layer of the electrically conductive material.

The barrier layer preferably comprises a nitride film. In this case, the barrier layer may have a single layer structure consisting of the nitride film, or a laminate structure comprising the nitride film and any other electrically conductive material film. Examples of the nitride film include a TiN film and a TaN film. An electrically conductive material such as silicon may also be employed as a material for the barrier layer.

An example of the first interconnection layer is an aluminum interconnection layer (composed of metal aluminum or an aluminum alloy such as an Al—Si alloy or an Al—Cu alloy).

The nitride film constituting the barrier layer is preferably a film having an anti-reflection property. With this arrangement, the nitride film constituting the barrier layer functions as an anti-reflection film in a photolithography process for patterning the first interconnection layer.

Since an apparatus for the formation of the anti-reflection film is generally incorporated in a semiconductor device production system, the anti-reflection film formation apparatus may be employed for the formation of the nitride film constituting the barrier layer. Therefore, the existing production system can be employed for the production of the semiconductor device of the present invention.

The barrier layer is preferably configured to be conformal to the first interconnection layer with at least apart thereof adjacent to the interlevel connection opening region being planar (or flat). The nitride film included in the barrier layer may have such a configuration.

The barrier layer preferably has a thickness in a range from 200 Å to 1000 Å (more preferably from 500 Å to 1000 Å). The nitride film having a thickness within this range can assuredly prevent the diffusion of gold from the second interconnection layer in the heat treatment process, and is free from penetration when being etched for the formation of the interlevel connection opening.

Although the nitride film serving as the anti-reflection film generally has a thickness of not greater than 300 Å, the nitride film preferably has a thickness within the aforesaid range for prevention of the diffusion of gold.

A semiconductor device production method according to the present invention comprises the steps of: forming a first interconnection layer on a semiconductor substrate; forming an interlevel insulation film which covers the first interconnection layer; forming an interlevel connection opening at a predetermined position in the interlevel insulation film to expose a part of the first interconnection layer; forming a barrier layer on a region of the first interconnection layer after the formation of the first interconnection layer but before the formation of the interlevel insulation film, the region of the first interconnection layer including an interlevel connection opening region where the interlevel connection opening is formed in the interlevel insulation film, and having a greater area than the interlevel connection opening region; and forming a second interconnection layer of gold as an uppermost interconnection layer on the interlevel insulation film so as to electrically connect the second interconnection layer to the first interconnection layer via the barrier layer in the interlevel connection opening.

In this method, the barrier layer is formed on the great area region of the first interconnection layer, and the interlevel insulation film is formed over the barrier layer. The barrier layer is exposed from the interlevel connection opening formed in the interlevel insulation film. Therefore, the barrier layer is free from the problem associated with the coverage around the interlevel connection opening, so that the barrier layer can be formed as having a uniform thickness to provide an excellent barrier effect with respect to the second interconnection gold layer.

The aforesaid method preferably further comprises the step of forming an adhesive layer of an electrically conductive material on the interlevel insulation film and in the interlevel connection opening in contact with the interlevel insulation film and the barrier layer exposed in the opening to bond the second interconnection layer to the interlevel insulation film and the barrier layer after the formation of the interlevel insulation film but before the formation of the second interconnection layer.

The first interconnection layer forming step and the barrier layer forming step preferably comprises the steps of: forming a metal material film for the first interconnection layer on the semiconductor substrate; forming the barrier layer on the metal material film; forming a resist pattern film having a pattern corresponding to the first interconnection layer on the barrier layer; and etching the metal material film and the barrier layer by employing the resist pattern film as a common mask to form the first interconnection layer and pattern the barrier layer so as to cover the first interconnection layer with the barrier layer.

In this method, the first interconnection layer and the barrier layer are patterned by the etching employing the resist pattern film as the common mask, whereby the barrier layer is formed as covering the entire first interconnection layer. The barrier layer thus formed has a uniform thickness, and has an excellent barrier effect with respect to the second interconnection layer.

The resist pattern film forming step preferably comprises the steps of forming a resist film to cover the entire barrier layer, and exposing the resist film to light so as to allow the resist film to have a pattern corresponding to the first interconnection layer. The barrier layer forming step preferably comprises the step of forming the barrier layer from a nitride material having an anti-reflection function for blocking light reflected from the first interconnection layer in the exposure step.

In this method, the nitride film formed as covering the first interconnection layer serves as an anti-reflection film, so that a resist pattern film can properly be formed.

The foregoing and other objects, features and effects of the present invention will become more apparent from the following description of the preferred embodiments with reference to the attached drawings.

BRIEF DESCRIPTION OF THE DRAWINGS

FIGS. 2(a) to 2(g) are sectional views illustrating a process sequence for production of the semiconductor device.

DESCRIPTION OF THE PREFERRED EMBODIMENTS

Figure 1:
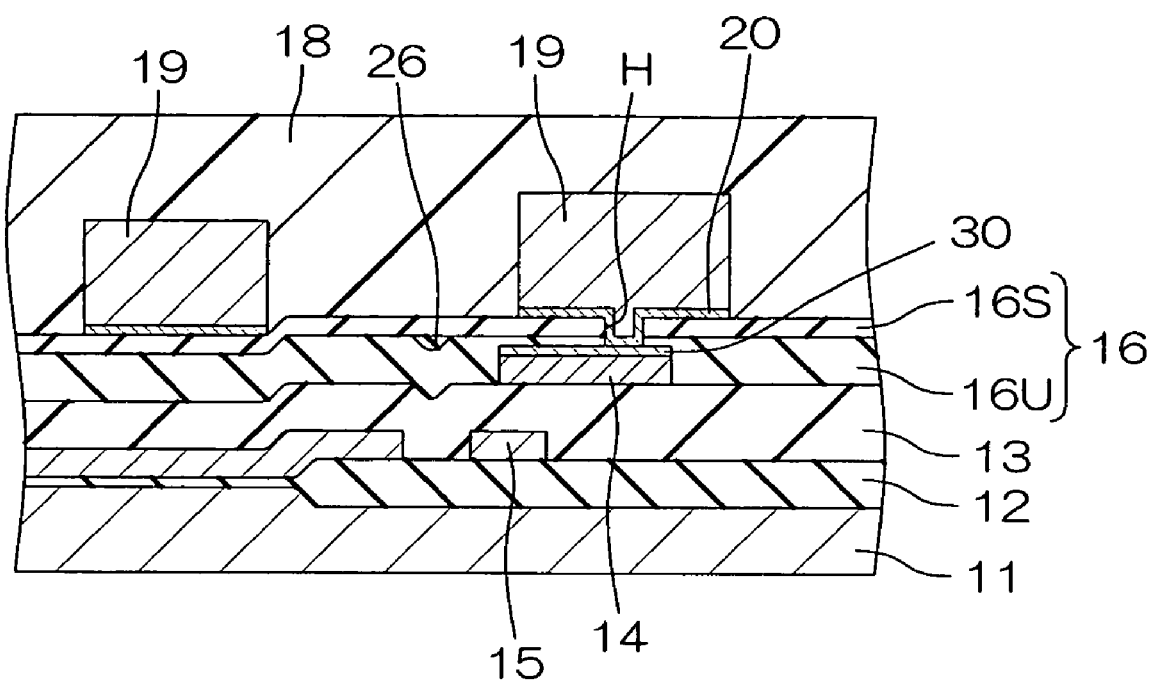
FIG. 1 is a sectional view illustrating the construction of a semiconductor device according to one embodiment of the present invention.

FIG. 1 is a sectional view illustrating the construction of a semiconductor device according to one embodiment of the present invention. The semiconductor device has a polysilicon interconnection 15 provided on a silicon substrate 11 formed with a field oxide film 12.

An interlevel insulation film 13 entirely covers the field oxide film 12 and the polysilicon interconnection 15. An aluminum interconnection layer 14 is provided as a first interconnection layer on the interlevel insulation film 13. A TiN (titanium nitride) film 30 (barrier layer) is provided as an electrically conductive nitride film to cover a surface of the aluminum interconnection layer 14. In this embodiment, the TiN film 30 has the same pattern as the aluminum interconnection layer 14, and covers the entire surface of the aluminum interconnection layer 14.

The TiN film 30 and the interlevel insulation film 13 are entirely covered with an interlevel insulation film 16 of a laminate structure which includes a USG (undoped silicate glass) layer 16U and a silicon nitride film 16S covering the entire surface of the USG layer 16U. That is, the TiN film 30 is disposed below the interlevel insulation film 16, and intervenes between the aluminum interconnection layer 14 and the interlevel insulation film 16.

A gold interconnection layer (interconnection layer of gold) 19 is provided as a second interconnection layer (uppermost interconnection layer) on the interlevel insulation film 16. The gold interconnection layer 19 and the interlevel insulation film 16 are entirely covered with a polyimide resin film 18, which has a planar surface.

The interlevel insulation film 16 has a contact hole H formed therein at a predetermined position to expose a part of the TiN film 30 underlying the interlevel insulation film 16. The aluminum interconnection layer 14 and the gold interconnection layer 19 are electrically connected to each other via the TiN film 30 through the contact hole H. In this case, the TiN film 30 functions as the barrier layer for preventing the diffusion of gold which is a material metal for the gold interconnection layer 19. The TiN film 30 is flatly (or planarly) provided on a region of the aluminum interconnection layer 14 which includes a region of the contact hole H and has a greater area than the contact hole region. Therefore, the TiN film 30 is free from the problem associated with the coverage in the contact hole H and, hence, advantageously has a uniform thickness. FIG. 1 shows that the surface of the interlevel insulation film 16 is generally or substantially parallel to the flat TiN film 30, and that the interlevel insulation film 16 therefore has a substantially flat surface in the region of the TiN film 30. For example, the interlevel insulation film 16 surface does not comprise two portions of different heights or different shapes. Here, the phrase "substantially flat" does not relate to surface roughness but to overall or geometrical shape.

A TiW film 20 functioning as an electrically conductive adhesive layer for bonding the gold interconnection layer 19 to the TiN film 30 and the interlevel insulation film 16 is provided between the gold interconnection layer 19 and the TiN film 30 and between the gold interconnection layer 19 and the interlevel insulation film 16.

With this arrangement, the TiN film 30 can effectively prevent gold of the gold interconnection layer 19 from diffusing into the aluminum interconnection layer 14 even if the semiconductor device is allowed to stand in a high temperature environment in an alloying process after the production of the semiconductor device. Further, the TiN film 30, which is one type of the nitride film, is excellent in corrosion resistance, and exhibits a high corrosion resistance even in a pressure cocker test environment.

To ensure the higher barrier effect of the TiN film 30 and prevent the contact hole H from penetrating through the TiN film 30 in the etching for the formation of the contact hole H, the thickness of the TiN film 30 is preferably 200 Å to 1000 Å, more preferably 500 Å to 1000 Å.

FIGS. 2(a) to 2(g) are sectional views illustrating a process sequence for production of the aforesaid semiconductor device. As shown in FIG. 2(a), a device isolation film 12 is first formed in a surface of a silicon substrate 11 to define a device region, and an interconnection 15 of a polysilicon film is formed in the device region on the silicon substrate 11.

Then, as shown in FIG. 2(b), an interlevel insulation film 13 of a BPSG film is formed over the resulting substrate, and an aluminum interconnection material film 140 which is connected to the polysilicon interconnection 15 through a contact hole not shown is formed over the entire resulting substrate. Further, a TiN film 30 having a thickness of 500 Å to 1000 Å is formed over the aluminum interconnection material film 140 to entirely cover the aluminum interconnection material film 140. The formation of the aluminum interconnection material film 140 and the TiN film 30 is achieved by a sputtering method. For example, the aluminum interconnection material film 140 is first formed by sputtering, and then the TiN film 30 is formed on the aluminum interconnection material film 140 by sputtering with the substrate 11 kept in vacuum.

Further, as shown in FIG. 2(c), a resist 40 is applied onto the TiN film 30, and exposed to light with the use of a mask 41 having a pattern corresponding to a pattern of the aluminum interconnection layer 14. At this time, the TiN film 30 functions as an anti-reflection film to block light reflected from the aluminum interconnection material film 140 for prevention of unwanted exposure of the resist 40 to the reflected light. Thus, the exposure of the resist 40 can advantageously be achieved. Therefore, the resist 40 can be patterned into a desired pattern in a subsequent developing process.

Then, as shown in FIG. 2(d), the TiN film 30 and the aluminum interconnection layer 14 are patterned by etching with the use of the patterned resist 40 as a common mask. As a result, the TiN film 30 having the same pattern as the aluminum interconnection layer 14 is provided as covering the entire surface of the aluminum interconnection layer 14.

Thereafter, as shown in FIG. 2(e), a USG (undoped silicate glass) is deposited on the resulting substrate by a CVD (chemical vapor deposition) method or the like to form a USG layer 16U, and further a silicon nitride film 16S is formed over the USG layer 16U by a plasma CVD method. Thus, an interlevel insulation film 16 is formed. A contact hole H is formed at a predetermined position in the interlevel insulation film 16 by dry etching. Where a plurality of contact holes H are formed on the silicon substrate 11, the contact holes preferably have a uniform diameter on the order of not greater than 3 μm. Thus, the etching rate over the substrate 11 can be made uniform, and the selectivity ratio of the silicon nitride film 16S to the TiN film 30 can be increased.

Thereafter, a TiW film 20 is formed over the entire resulting substrate, for example, by a sputtering method as illustrated on a greater scale in FIG. 2(f).

In turn, as shown in FIG. 2(g), a gold seed layer 19S is formed over the entire resulting substrate. The formation of the seed layer 19S may be achieved through a sequential sputtering method by switching a target from TiW to gold in a treatment chamber employed for the formation of the TiW film 20.

Then, a resist 24 is formed as covering the entire seed layer 19S. An opening 24a corresponding to a gold interconnection layer 19 is formed in the resist 24. In this state, a gold electrolytic plating process is performed, whereby the gold interconnection layer 19 grows in the opening 24a.

Thereafter, the resist 24 is removed, and a part of the seed layer 19S and a part of the TiW film 20 not covered with the gold interconnection layer 19 are etched away. Then, for example, a 2 μm thick polyimide resin film 18 is formed as a passivation film by coating. Thus, a semiconductor device having a construction as shown in FIG. 1 is provided.

Further, openings may be formed at predetermined positions in the polyimide resin film 18 above the gold interconnection layer 19 for connection between the gold interconnection layer 19 and external connection terminals (not shown) by bonding wires.

Figure 3:
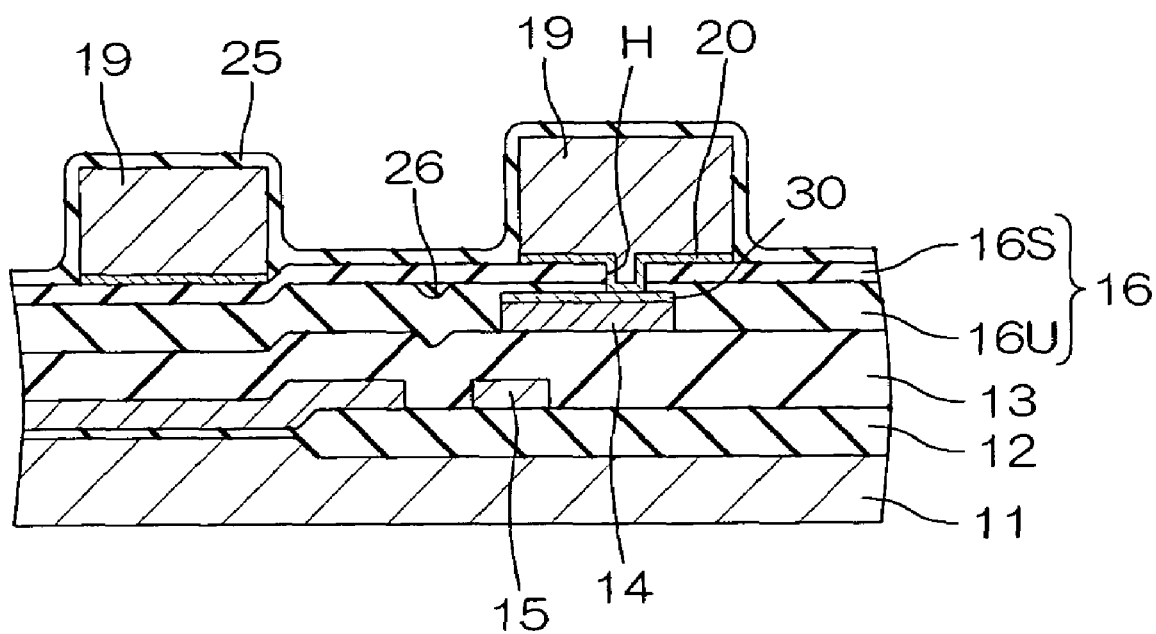
FIG. 3 is a sectional view illustrating the construction of a semiconductor device according to another embodiment of the present invention.

FIG. 3 is a sectional view illustrating the construction of a semiconductor device according to another embodiment of the present invention. In FIG. 3, components corresponding to those shown in FIG. 1 will be denoted by the same reference characters as in FIG. 1.

In this embodiment, a silicon nitride film 25 is provided instead of the polyimide resin film 18 as the passivation film. That is, after the resist 24 is removed and unnecessary portions of the seed layer 19S and the TiW film 20 are etched away in the state shown in FIG. 2(g), the silicon nitride film 25 is formed over the entire resulting substrate, for example, by a plasma CVD method. Thus, a semiconductor device as shown in FIG. 3 is provided.

With this arrangement, the corrosion resistance of the semiconductor device can further be improved, because the silicon nitride film 25 herein employed is highly dense and has a high passivation effect. When the silicon nitride film 25 is formed by the plasma CVD method, the semiconductor device is allowed to stand in a high temperature environment. Even in this case, the TiN film 30 prevents the diffusion of gold into the aluminum interconnection layer 14 from the gold interconnection layer 19.

While the two embodiments of the present invention have thus been described, the invention may be embodied in other ways. Although the polyimide resin film 18 is employed as the passivation film in the embodiment shown in FIG. 1, and the silicon nitride film 25 is employed as the passivation film in the embodiment shown in FIG. 3, neither the polyimide resin film 18 nor the silicon nitride film 25 may be provided, that is, no passivation film may be provided. Even in this case, the gold interconnection layer 19 exposed to a surface of the semiconductor device has a sufficient corrosion resistance, and the surface of the interlevel insulation film 16 is constituted by the silicon nitride film 16S having a high passivation effect. Further, the TiN film 30 is excellent in corrosion resistance. Therefore, the semiconductor device totally has a sufficient corrosion resistance.

Besides the BPSG film, a PSG film (a silicon oxide film doped with phosphorus) or a USG film may be employed as the interlevel insulation film 13.

Further, an organic insulative silicon compound (organic SOG) which permits easy formation of a thicker film may be applied on the deposited USG film 16U as filling a recess in an upper surface of the USG layer 16U by an SOG (spin on glass) method to form an organic SOG layer 26 (see FIGS. 1 and 3), and then the silicon nitride film 16S may be formed by a high density plasma CVD method.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 2003-314240 filed with the Japanese Patent Office on Sep. 5, 2003, the disclosure of which is incorporated herein by reference.

What is claimed is:

1. A semiconductor device, comprising:
   a first interconnection layer provided on a semiconductor substrate;
   an interlevel insulation film provided over the first interconnection layer, the interlevel insulation film having an interlevel connection opening formed therein in an interlevel connection opening region;
   a barrier layer provided between the first interconnection layer and the interlevel insulation film on a region of the first interconnection layer including the interlevel connection opening region, the region having a greater area than the interlevel connection opening region; and
   a second interconnection layer of gold provided as an uppermost interconnection layer on the interlevel insulation film and electrically connected to the first interconnection layer via the barrier layer in the interlevel connection opening;
   wherein the interlevel insulation film includes a covering layer continuously extending from a side of the first interconnection layer to above the first interconnection layer,
   wherein the barrier layer is disposed between the covering layer and the first interconnection layer; and
   wherein the interlevel insulation film has a substantially flat surface.

2. A semiconductor device as set forth in claim 1, further comprising an adhesive layer of an electrically conductive material provided between the interlevel insulation film and the second interconnection layer and between the barrier layer and the second interconnection layer in the interlevel connection opening, the adhesive layer bonding the second interconnection layer to the interlevel insulation film and the barrier layer.

3. A semiconductor device as set forth in claim 1, wherein the barrier layer includes a nitride film.

4. A semiconductor device as set forth in claim 3, wherein the nitride film constituting the barrier layer is a film having an anti-reflection property.

5. A semiconductor device as set forth in claim 1, wherein the barrier layer is configured to be conformal to the first interconnection layer with at least a part thereof adjacent to the interlevel connection opening region being planar.

6. A semiconductor device as set forth in claim 1, wherein the barrier layer has a thickness in a range from 200 Å to 1000 Å.

7. A semiconductor device as set forth in claim 1, wherein the barrier layer is flat and a surface of the interlevel insulation film is substantially parallel to the flat surface of the barrier layer.

8. A semiconductor device as set forth in claim 1, wherein the interlevel insulation film has a substantially flat surface in a region adjacent to the first interconnection layer.

9. A semiconductor device as set forth in claim 1, wherein the interlevel insulation film includes a first layer, a second layer, and a third layer filling a recess in the second layer.

10. A semiconductor device as set forth in claim 9, wherein the first layer comprises an undoped silicate glass film, the second layer comprises silicon nitride, and the third layer comprises an organic insulative silicon compound.

* * * * *